(12) United States Patent
Gruening et al.

(10) Patent No.: US 6,451,648 B1
(45) Date of Patent: Sep. 17, 2002

(54) PROCESS FOR BURIED-STRAP SELF-ALIGNED TO DEEP STORAGE TRENCH

(75) Inventors: Ulrike Gruening, Wappingers Falls; Jack A. Mandelman, Stormville; Carl J. Radens, LaGrangeville, all of NY (US)

(73) Assignees: International Business Machines Corporation, Armonk, NY (US); Infineon Technologies AG (DE)

( * ) Notice: Subject to any disclaimer, the term of this patent is extended or adjusted under 35 U.S.C. 154(b) by 0 days.

(21) Appl. No.: 09/233,887

(22) Filed: Jan. 20, 1999

(51) Int. Cl.[7] .......................................... H01L 21/8242
(52) U.S. Cl. ................... 438/243; 438/248; 438/386; 438/391; 438/424
(58) Field of Search ................... 438/243, 245–252, 438/386, 388–392

(56) References Cited

U.S. PATENT DOCUMENTS

| 5,395,786 A | * | 3/1995 | Hsu et al. ................ 438/248 |
| 5,525,531 A | * | 6/1996 | Bronner et al. ........... 438/152 |
| 5,614,431 A | | 3/1997 | DeBrosse ................. 438/243 |

FOREIGN PATENT DOCUMENTS

| JP | 11074474 | 3/1999 | |
| JP | 411168203 | * 6/1999 | ....... H01L/21/8242 |

OTHER PUBLICATIONS

IBM Technical Disclosure Bulletin, vol. 33, No. 10A, Mar. 1991, "Process Scheme to Make Shallow Trench Isolation Self–Aligned to the Storage Trench" pp. 260–262.

* cited by examiner

*Primary Examiner*—Wael Fahmy
*Assistant Examiner*—Toniae M. Thomas
(74) *Attorney, Agent, or Firm*—Daryl K. Neff; Todd M. C. Li; Connolly Bove Lodge & Hutz LLP

(57) ABSTRACT

A process for forming a buried strap self-aligned to a deep storage trench. Spacers are formed on walls of a recess over a filled deep trench capacitor and a substrate. A plug is formed in a region between the spacers. Photoresist is deposited over the spacers, the plug, and material surrounding the spacers of the plug. The photoresist is patterned, thereby exposing portions of the plug, the spacers, and the surrounding material. The spacers in the surrounding material not covered by the photoresist are selectively etched, leaving a remaining portion of the spacers. The substrate and the portion of the filled deep trench exposed by the spacer removal are selectively etched. An isolation region is formed in a space created by etching of the spacers, surrounding material, substrate, and filled deep trench.

22 Claims, 5 Drawing Sheets

US 6,451,648 B1

PROCESS FOR BURIED-STRAP SELF-ALIGNED TO DEEP STORAGE TRENCH

FIELD OF THE INVENTION

The invention relates to semiconductor devices. In particular, the present invention relates to dynamic random access memory (DRAM) devices.

BACKGROUND OF THE INVENTION

Increasing numbers of semiconductor devices, such as individual memory cells, are being created on a single chip. As a result, dimensions of the devices continue to shrink. Shrinking device dimensions can increase the difficulty of and errors aligning device structures and the difficulty of ensuring proper alignment an adequate functional area of structures included in semiconductor devices.

SUMMARY OF THE INVENTION

The present invention provides a method and semiconductor device structure for helping to ensure proper alignment of elements of semiconductor device structures in light of the increasingly reduced dimensions of semiconductor devices and elements forming the devices.

The present invention provides a process for forming a buried strap self-aligned to a deep storage trench. According to the process, spacers are formed on walls of a recess over a filled deep trench capacitor and a substrate. A plug is formed in a region between the spacers. Photoresist is deposited over the spacers, the plug, and material surrounding the spacers of the plug. The photoresist is patterned, thereby exposing portions of the plug, the spacers, and the surrounding material. The spacers in the surrounding material not covered by the photoresist are selectively etched, leaving a remaining portion of the spacers. The portion of the substrate not protected by the photoresist is selectively etched. An isolation region is formed in a space created by the etching of the spacers and substrate.

The present invention also provides a semiconductor device including a substrate. A deep trench capacitor is arranged in the substrate. The deep trench capacitor is filled with a semiconductor material. A collar is arranged on the wall of the deep trench. A trench top region is arranged in the vicinity of a top of the trench over the trench fill and the collar. An isolation region extends into the deep trench, the trench collar, and the trench top region.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

As dimensions are reduced in deep trench storage DRAM arrays, variation in buried strap resistance may increase due to increased active area-deep trench overlay tolerance relative to sizes of features in the array. One technique for addressing this problem is to provide a strap formation process that is independent of active area-deep trench overlay. This process may be refereed to as a "merged active area-deep trench strap process." Although a buried strap resulting from a merged active area-deep trench strap process may not suffer from variations in resistance due to active area-deep trench overlay errors, formation of spurious straps between the deep trench and a neighboring active area is likely to occur with extreme active area-deep trench misalignment and/or large active area or deep trench photo and etch bias tolerance.

Figure 1:
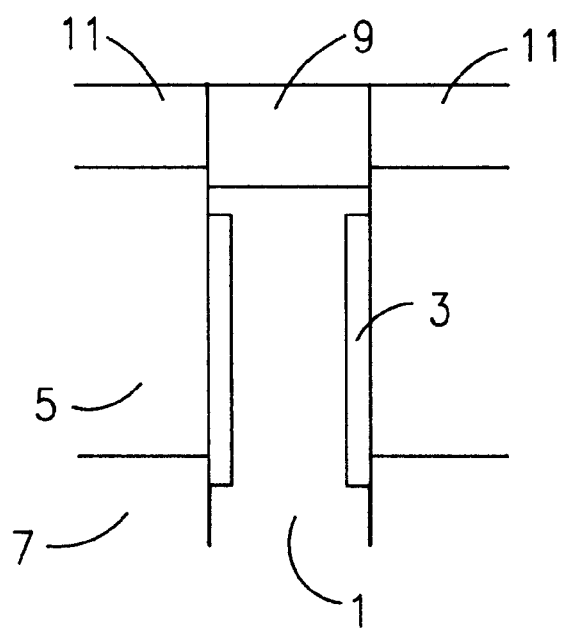
FIG. 1 represents a cross-sectional view of a portion of a known semiconductor device structure.

The following provides a brief description of a merged active area deep trench strap process in part to better explain the spurious strap formation problem associated with a merged active area-deep trench strap process. FIG. 1 illustrates a cross-sectional view of a semiconductor device structure. The structure illustrated in FIG. 1 includes a deep trench 1 arranged in a substrate. The deep trench is filled with polycrystalline silicon.

A collar 3 is arranged at a wall of the deep trench. A variety of processes may be utilized to form collar 3 and deep trench side walls. The present invention permits local oxidation of silicon (LOCOS) to be utilized to form the collar. The collar 3 may also be formed by deposition of a CVD oxide followed by RIE, which is known to those skilled in the art.

A p-well 5 is arranged in the substrate adjacent the deep trench. An n+ plate 7 is arranged in the substrate adjacent the deep trench and below the p-well.

A trench top structure 9 is arranged overlying the deep trench. In the structure illustrated in FIG. 1, the trench top structure is an oxide. Nitride pad regions 11 are arranged on the surface of the substrate surrounding the deep trench and abutting the trench top region 9.

In the state illustrated in FIG. 1, the material filling the deep trench has been recessed and the insulating trench top region 9 created and planarized to the nitride pad 11. At this point in the process, photoresist may be deposited over the entire upper surface of the structure illustrated in FIG. 1. The photoresist may then be patterned according to typical photolithography practices.

Figure 2:
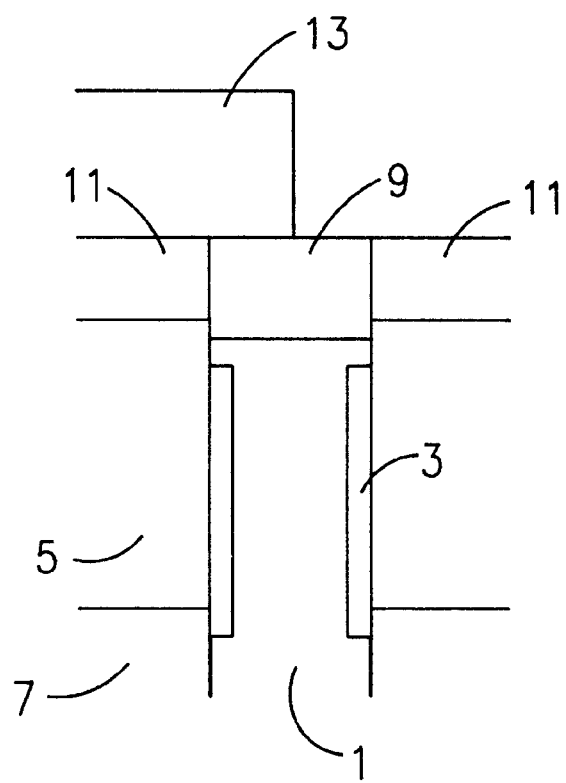
FIG. 2 represents a cross sectional view of the portion of a semiconductor device structure illustrated in FIG. 1, wherein additional processing has been carried out on the structure.

FIG. 2 illustrates the resulting structure. As shown in FIG. 2, at least one region of 13 of photoresist remains on the upper surface of the structure covering portions of nitride pad 11 and trench top region 9. The photoresist region(s) 13 helps to define the active area of the device.

Utilizing the union of the photoresist pattern and the trench top region 9 over the deep trenches as a mask, exposed nitride pad may be etched to the underlying substrate surface. The etch may be carried out with a reactive ion etch. The exposed silicon substrate may then be etched, selective to the trench top region 9 and the photoresist region 13. Etching of the nitride pad 11 and the subsequently exposed substrate helps to define an isolation region which may then filled with material and planarized.

Figure 3:
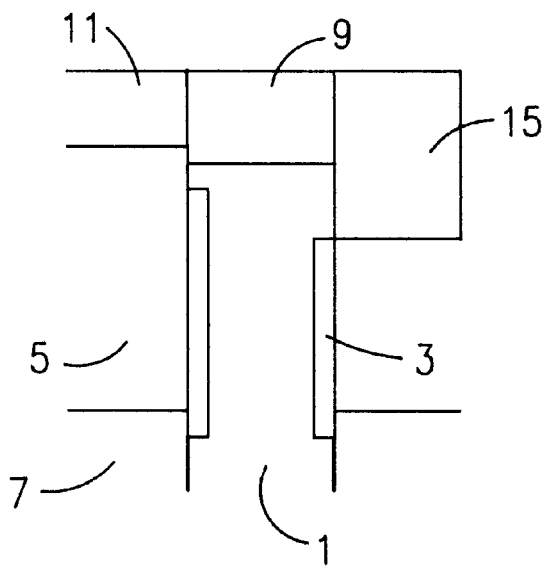
FIG. 3 represents a cross-sectional view of the portion of a semiconductor device structure illustrated in FIGS. 1 and 2 wherein the structure has been further processed.

FIG. 3 illustrates the resulting structure. The isolation regions typically are shallow trench isolation regions. FIG. 3 also illustrates isolation region 15. According to the process illustrated in FIGS. 1–3, the overall pattern for the isolation is defined by the union of the active area mask and the trench top region over the deep trench.

Figure 4:
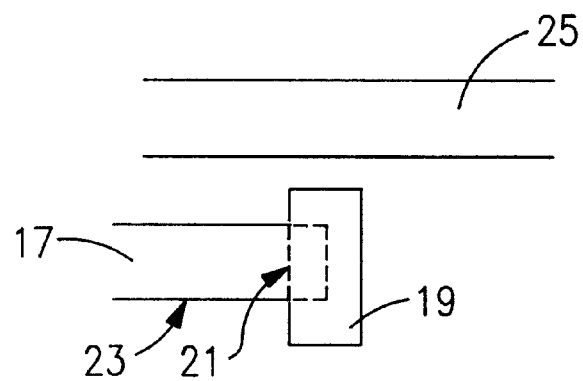
FIG. 4 represents an overhead view of a portion of a semiconductor device structure illustrating the relative positions of various elements of the structure.

FIG. 4 illustrates an overhead view of a structure that may be formed by a process such as that illustrated in FIGS. 1–3. FIG. 4 illustrates an active area pattern 17 and deep trench/trench top region 19. In this structure, the shallow trench isolation pattern in this structure is defined by the area outside of the union of the active area mask and the trench top region cap over the deep trench. The overlap of the active area and the deep trench defines a strap 21. The union of the active area and deep trench is outlined by line 23. FIG. 4 also illustrates an adjacent active area 25.

In the structure such as that illustrated in FIG. 4, when the deep trench is misaligned with the active area, and/or photo or etch bias is excessive, the deep trench edge may come close enough to an adjacent active area region to result in active area to deep trench bridging. This may result in a spurious strap 27 between the deep trench and the adjacent active area as illustrated in FIG. 5.

Figure 5:
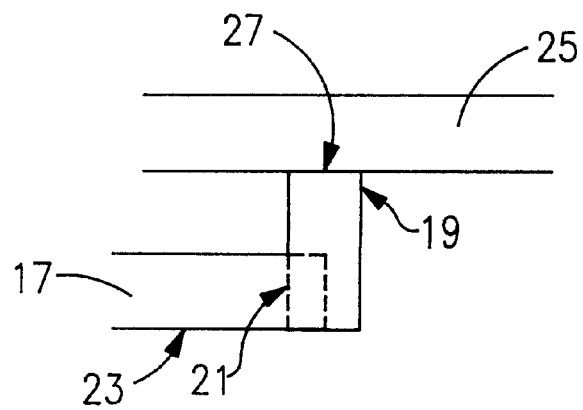
FIG. 5 represents an overhead view of a portion of another semiconductor device structure illustrating a less favorable relative position of various elements of the structure.

FIG. 5 illustrates the active area pattern 17, deep trench 19, strap 21, with the union of the active area and the deep trench outlined by bold line 23. However, unlike the structure illustrated in FIG. 4, the deep trench illustrated in FIG. 5 misaligned with the active area 17 such that the deep trench 19 or trench top region is in the vicinity of adjacent active area 25. The deep trench and active area may actually touch or slightly overlap. The proximity of deep trench 19 and adjacent area 25 in the embodiment illustrated in FIG. 5 results in formation of spurious strap 27.

As a result of the arrangement illustrated in FIG. 5, the memory cells associated with the active area 17 and 25 both fail. To help ensure that spurious straps are not formed, the size of the deep trench has been reduced. In other words, the deep trench size is reduced from 2×1. In other words, the width of the trench, when viewed from above, is twice the length. However, reducing the size of the deep trench further reduces storage capacitance, which in the reduced dimensions of contemporary DRAM structures is already in short supply.

The present invention provides a method for forming a memory cell including an improved process for forming a buried strap self-aligned to a deep trench. According to the present invention, a buried strap is formed that is insensitive to active area-deep trench overlay tolerance. A buried strap according to the present invention also has substantially improved immunity to spurious strap formation between a deep trench and an adjacent active area not associated with the deep trench. Because of the substantially improved immunity to spurious strap formation, the size of the storage trench may be made larger than the reduced dimensions storage trenches utilized in the method illustrated in FIGS. 1–5. Therefore, not only does the present invention provide a process for forming a buried strap to a deep trench capacitor that is insensitive to active area-deep trench overlay, but the present invention also does not require reduction in storage capacitance to guarantee high yield.

Figure 6:
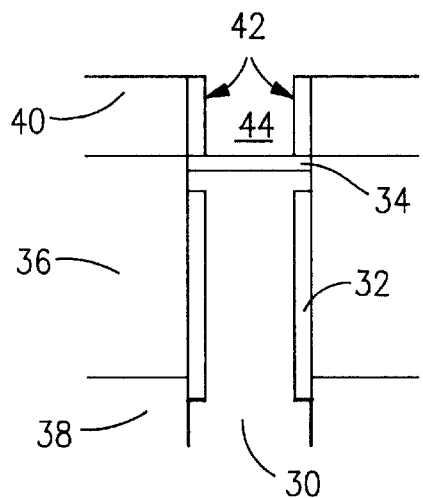
FIG. 6 represents a cross-sectional view of an embodiment of a semiconductor device structure according to the present invention at one stage of an embodiment of a process according to the present invention.

FIG. 6 illustrates an embodiment of a structure according to the present invention at one stage of an embodiment of a process according to the present invention. The structure illustrated in FIG. 6 includes a deep trench 30. The deep trench may be filled with polycrystalline silicon. The polycrystalline silicon may be n+ doped. A collar 32 may be arranged on a portion of the walls of the deep trench. The substrate may include an n+ plate 38 arranged adjacent the deep trench as well as a p-well 36 arranged above the n+ plate and adjacent the deep trench 30.

A region 40 of material may be arranged on the surface of the structure, in other words, the upper surface of the substrate, with the exception of the region over the deep trench. The material forming the region 40 may be a dielectric material. One example of a material that may be utilized in region 40 is a nitride.

A trench top region 34 may be arranged at the top of the filled deep trench 30. The trench top region may be formed by filling a cavity over the trench fill, planarizing the material filling the cavity and recessing the material filling the cavity. The trench top may comprise a dielectric material. One example of a dielectric that the trench top may be formed of is an oxide. The trench top material may be formed by chemical vapor deposition or any other suitable process.

The upper surface of the trench top region 34 may be co-planar or substantially co-planar with the upper surface of the substrate. The upper surface of the trench top region or cap 34 may lie slightly above or slightly below the upper surface of the substrate. The upper surface of the substrate being the surface that abuts the lower surface of region 40.

According to the present invention, spacers 42 may be formed on a wall of recess 44 in region 40 above the deep trench. The spacers may be formed of a variety of materials. According to one example, a dielectric material is utilized to form the spacers. One example of a dielectric material that may be utilized to form the spacers is a nitride. According to one example, silicon nitride is utilized to form the spacers.

The spacers may be formed according to a variety of processes. Two particular examples of such processes are described herein. Other process might also be utilized to form the spacers and one skilled in the art could identify alternative methods for forming the spacers without undue experimentation once aware of the disclosure contained herein.

According to a first example of a spacer forming process according to the present invention, the spacer material is deposited in the recess 44. The spacer material may then be etched to form spacers 42 as illustrated in FIG. 6. The spacer material may be etched by a reactive ion etch process.

According to the first embodiment of the present invention for forming the spacers, a dielectric material may then be deposited in the region between the spacers. The material 46 deposited on the region between the spacers may be deposited to fill the region between the spacers. Excess material lying outside of the region between the spacers may be removed by planarizing the top surface of the entire structure.

Figure 7:
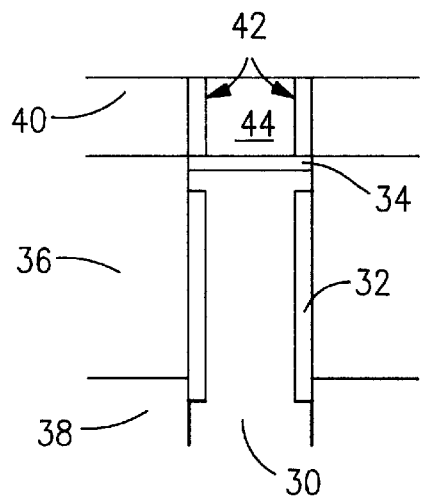
FIG. 7 represents a cross-sectional view of the structure illustrated in FIG. 6 at a later stage in the process.

The material 46 deposited between the spacers may be of a dielectric material. One example of a dielectric material that may be utilized is an oxide. The material 46 may be deposited according to a variety of processes. According to one example, chemical vapor deposition is utilized to deposit the material 46. Material 46 forms a plug above the deep trench 30 and the region between the spacers 42. FIG. 7 illustrates the resulting structure.

Figure 8:
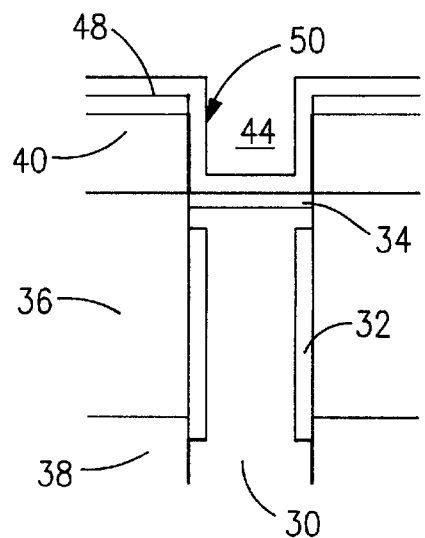
FIG. 8 represents a cross-sectional view of another embodiment of the semiconductor device structure according to the present invention at one stage of another embodiment of a process according to the present invention.
Figure 9:
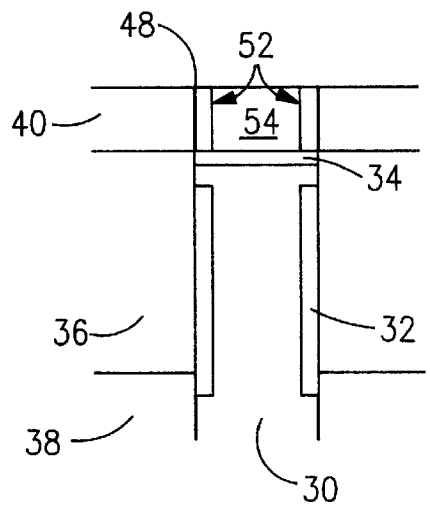
FIG. 9 represents a cross-sectional view of the embodiment illustrated in FIG. 8 after carrying out further processing.

FIGS. 8 and 9 illustrate stages of a second example of a process for forming spacers according to the present invention. The process illustrated in FIGS. 8 and 9 and described below may be more robust process than the first process described above. Along these lines, the process described below and illustrated in FIGS. 8 and 9 may improve control over thickness of the trench top region 34 due to over etch of the trench top material.

Unlike the first process for forming the spacers described above, rather than depositing the spacer material in the recess above the deep trench, first, a layer of material is deposited on exposed surfaces of the structure and the recess. Layer 48 is differentially thick. Along these lines, layer 48 is thicker on the horizontal top surfaces of the substrate than on the vertical side walls of recess 44 above the deep trench. The trench top region 34 may be formed at this time. A layer of material may also be formed on the trench top region if the trench top region was previously formed.

A variety of processes may be utilized to form the differentially thick layer 48. According to one example, a high density plasma (HDP) process may be utilized to form the differentially thick layer 48. The HDP process may directionally deposit the layer 48 to result in the differential thickness of the layer such that the layer is thicker on horizontal surfaces than on side walls of the recess.

Differentially thick layer 48 may comprise a variety of materials. For example, differentially thick layer 48 may include dielectric material. One example of a dielectric that may be utilized is an oxide.

After depositing differentially thick layer 48, uniformly thick, or conformal, layer of material 50 may be deposited over the differentially thick layer 48. Prior to deposition of conformal layer 50, portions of differentially thick layer 48 on vertical surfaces may be etched. One example of an etch process that may be utilized to etch the vertical portions of layer 48 is an isotropic etch.

Conformal layer 50 may also be comprised of dielectric material. For example, according to one embodiment, conformal layer may be a nitride. One example of a nitride that may be utilized in conformal layer 50 is silicon nitride.

After depositing the conformal layer 50, the conformal layer may be etched. According to one example, the conformal layer is etched by a reactive ion etch. Spacers may then be considered to include the remaining portions 52 of the conformal layer. After etching of the conformal layer 50, differentially thick 48 may or may not remain on the upper surface of the structure.

After etching the conformal layer to form spacers 52, material 54 may be deposited in the region between the spacers. Material 54 deposited in the region between the spacers 52 may be dielectric material. According to one example, an oxide is deposited in the region between the spacers 52. Material 54 forms a plug in the region between the spacers 52 and above the deep trench.

After depositing material 54, the entire structure may be polished to remove excess portions of material 54 as well as portions of differentially thick layer 48 arranged on horizontal surfaces of the structure. The structure may be polished until reaching the top surface of region 40. FIG. 9 illustrates the resulting structure.

As can be appreciated by comparing FIGS. 7 and 9, at this point, the first process and the second process for forming the spacers can result in formation of similar structures. After formation of the spacers, the structure may be further processed. The further processing described below may be carried out on any structure including the spacers, regardless of the process utilized for forming the spacers.

The further processing may begin by applying the layer of photoresist over the entire structure including region 40, spacers 52 or 42, illustrated in FIG. 9 and FIG. 7 respectively, and plug 54 or 46. The photoresist may then be exposed and developed to result in a patterned layer of photoresist 56 on top of the structure.

Figure 10:
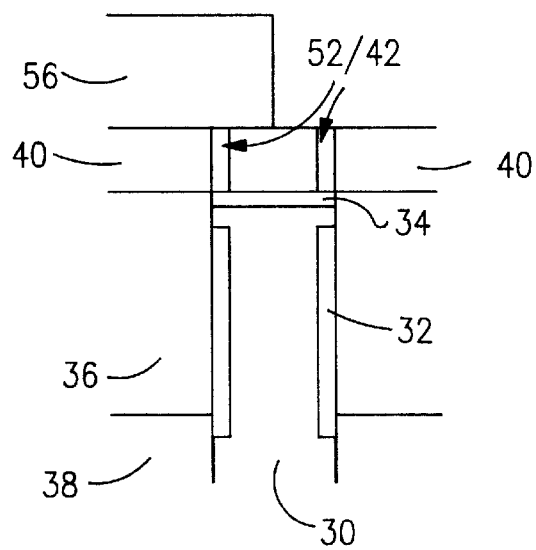
FIG. 10 represents a cross-sectional view of a semiconductor device structure such as that illustrated in FIGS. 7 or 9, after carrying out further processing, at a later stage in a process according to the present invention.

FIG. 10 illustrates one example of a patterned photoresist layer 56. As can be seen, at least a portion of plug 46/54, one of the spacers 42/52, and a portion of region 40 may be exposed by patterning the photoresist. According to the present invention, the photoresist region 56 should cover at least one of the spacer regions 42/52 illustrated in FIG. 10. This helps to ensure formation of a buried strap because of the nitride strip, described below, after FIG. 10 which opens the patterns to define the shallow trench isolation shape.

After patterning of the photoresist, portions of the structure revealed by the patterning may be etched away. For example, at this point in the process, any part of the spacers not covered by the photoresist may be removed. Removal of the spacer helps to create a buffer region around the deep trench merged with the active area. Typically, the mask is designed such that the nominal position of the edge of the photoresist 56 lies about midway across the trench.

According to one example, after patterning of the photoresist, exposed portions of spacer 42/52, and region 40 may be etched. These regions may be etched with a process that etches them at a much faster rate than other exposed areas, such as plug, 46/54 and photoresist. For example, certain reactive ion etch compositions may be utilized.

Etching of these regions defines an isolation region. The isolation region may be defined as regions outside of the union of the active area pattern and the difference between the deep trench and nitride spacer regions. In other words, the isolation regions may be defined by the union of the active area pattern and the plug or cap 46/54 over the deep trenches.

According to the method of the present invention, the region 40 and spacer 42/52 exposed by patterning of the photoresist may be etched. These areas may be etched by an reactive ion etch. Portions of the substrate underlying the region 40 that are exposed by etching of the region 40 as well as portions of the trench top structure 34 and trench fill may be etched after exposure by etching of spacer 42/52 and region 40. The underlying substrate and trench top 34 and trench 30 may be etched by a reactive ion etch selective to the material making up the collar 32 as well as the plug 46/54.

Figure 11:
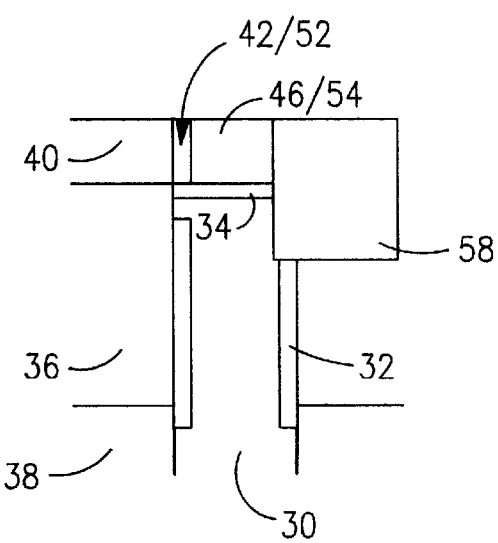
FIG. 11 represents a cross-sectional view of the embodiment illustrated in FIG. 10 after carrying out further processing.

As stated above, regions of the substrate, deep trench, trench top, region 40 and spacer removed during the etching form a region that may be an isolation region, typically a shallow trench isolation region. This isolation region may be filled with a material suitable for filling an isolation region. According to one example, a dielectric material is utilized to fill region 58. One example of such a material is an oxide. After etching and filling an isolation region 58, remaining portions of photoresist 56 may be removed. FIG. 11 illustrates the resulting structure.

Figure 12:
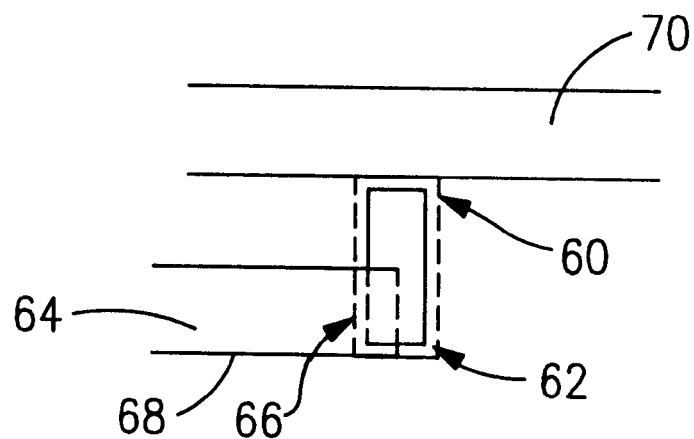
FIG. 12 represents an overhead view of an embodiment of a semiconductor device according to the present invention illustrating relative locations of various elements of the device.

FIG. 12 illustrates a structure formed according to the present invention illustrating that the use of the nitride spacers according to the present invention within the deep trench permits a larger deep trench size without forming a spurious strap. FIG. 12 illustrates a misaligned deep trench 60 and an associated spacer 62. The structure illustrated in FIG. 12 includes an active area pattern 64. Strap 66 exists between active area 64 and misaligned deep trench 60. Bold line 68 illustrates the union of the active area and the deep trench minus the spacer 62. FIG. 12 also illustrates an adjacent active area 70. As a result of the spacer, the structure illustrated in FIG. 12 will not result in the formation of a spurious strap between the misaligned deep trench 60 and the active area 70.

Further processing may be carried out on the structure illustrated in FIG. 11. The further processing may simply include standard processing techniques. For example, remaining region 40 and the remaining spacer 42/52 may be removed. According to one example, both region 40 and spacer 42/52 are formed of nitride. These nitride regions may be removed by etching in hot phosphoric acid. Sacrificial oxide, well implants, gate oxide, gate conductor definition, source-drain implants, interlevel dielectrics, wiring levels, among other structures may be formed as part of customary processing. During and following the removal of region 40 and spacer 42/52, the top surface of 58 and 46/54 may be eroded. This results in a substantially planar surface when wordlines are formed.

Figure 13:
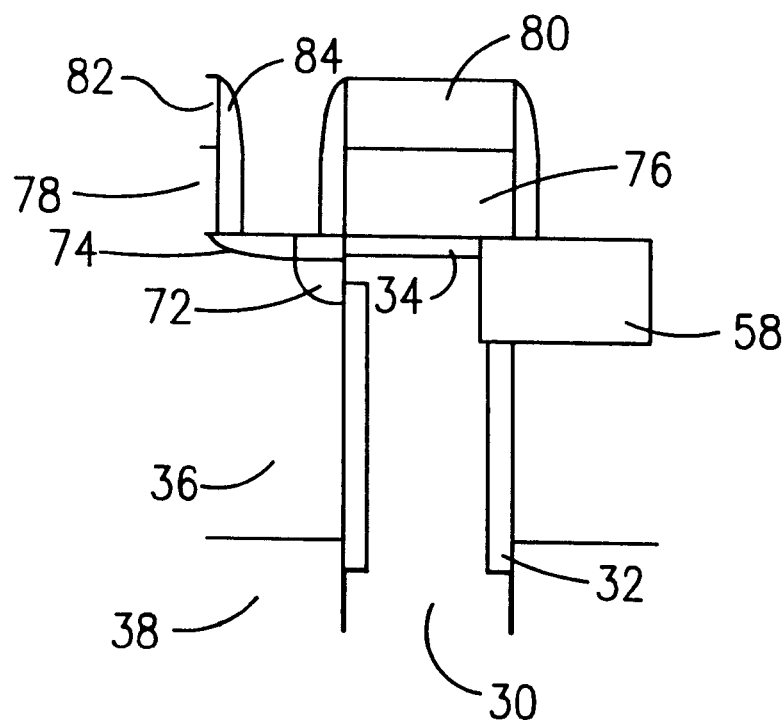
FIG. 13 represents a cross-sectional view of the embodiment illustrated in FIG. 11 after carrying out further processing.

FIG. 13 illustrates an embodiment of a structure following source-drain formation. As such, FIG. 13 illustrated buried strap outdiffusion 72, source/drain extension 74, passing wordline 76, active wordline 78, insulating caps 80 and 82 over passing wordline 76 and active wordline 78, respectively, and insulating sidewall spacers 84.

The present invention also includes a semiconductor device. A semiconductor device according to the present invention may be formed according to the above described processes. Alternatively, other processes may be utilized to form a semiconductor device according to the present invention. According to one embodiment, a semiconductor device according to the present invention may be a DRAM MOSFET device.

A semiconductor device according to the present invention may include a substrate. A deep trench may be arranged in the substrate and may be filled with a semiconductor material. The semiconductor material may be polycrystalline silicon. A collar may be arranged on a wall of the deep trench between the trench fill and the substrate that the deep trench is formed in. A trench top region may be arranged in the vicinity of a top of the trench over the trench fill and the collar. An isolation region may extend into the deep trench, the trench collar, and the trench top region.

In a semiconductor device according to the present invention the trench top region may be made of electrically insulating material. Also, the trench top region may be made of an oxide. Furthermore, the collar may be recessed below the trench top region. The materials comprising each region of a semiconductor device according to the present invention may be as described above in relation to a process of the present invention.

Advantages of the present invention include eliminating active area-deep trench overlay sensitivity of the buried strap resistance by merging the active area deep trench patterns. Processes according to the present invention greatly reduce the probability of spurious strap. Along these lines, removal of the spacer not covered by the photoresist pattern in the structure illustrated in FIG. 10 helps to create a buffer region around the deep trench merged with the active area. Formation of a spurious strap typically requires that the active area resist extend beyond the edge of the nitride spacer and overlap the trench top region. This overlap may be easily carried out utilizing currently existing overlay and image control techniques. Another advantage of the present invention is that removal of the spacer to form the isolation region helps to ensure overlap of the isolation region with the deep trench.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for forming a buried strap self-aligned to a deep storage trench, the process comprising:
   forming a spacer layer on walls of a recess over a filled deep trench capacitor in a substrate;
   forming a plug within an internal region defined by the spacer layer;
   depositing photoresist over the spacer layer, the plug, and material surrounding the spacer layer;
   patterning the photoresist to expose portions of the plug, the spacer layer, and the surrounding material;
   etching a portion of the spacer layer, the plug, the surrounding material, and the filled deep trench to a desired depth to form an open space; and
   forming an isolation region in the open space.

2. The process according to claim 1, wherein the spacer layer is formed of a first dielectric material, the plug is formed of a second dielectric material, the isolation region is formed of a third dielectric material, and the surrounding material is formed of a fourth dielectric material.

3. The process according to claim 2, wherein the first dielectric material is a nitride, the second dielectric material is an oxide, the third dielectric material is a nitride, and the fourth dielectric material is a nitride.

4. The process according to claim 1, further comprising:

removing the remaining portion of the spacer layer.

5. The process according to claim 4, wherein the remaining portion of the spacer layer is removed with phosphoric acid at a temperature above ambient temperature.

6. The process according to claim 1, wherein the surrounding material is a nitride layer on a surface of the substrate.

7. The process according to claim 1, wherein the recess is arranged over a trench top oxide layer deposited at the top of the filled deep trench.

8. The process according to claim 2, wherein the plug is formed by chemical vapor deposition.

9. The process according to claim 8, wherein after the internal region defined by the spacer layer is filled with the second dielectric material to form the plug, the plug is planarized to a top surface of the surrounding material.

10. The process according to claim 1, wherein forming the spacer layer comprises:

depositing material in the recess; and etching the material to form the spacer layer.

11. The process according to claim 10, wherein the material deposited in the recess is a first dielectric material.

12. The process according to claim 11, wherein the first dielectric material is a nitride and is etched by a reactive ion etch.

13. The process according to claim 1, wherein forming the spacer layer comprises:

depositing a differentially thick layer of material on all surfaces defining the recess and on surfaces surrounding an opening of the recess, such that the differentially thick layer is thicker on horizontal surfaces than on vertical surfaces;

depositing a uniformly thick layer of material on the differentially thick layer;

etching portions the uniformly thick layer lying outside of the recess;

removing portions of the differentially thick layer lying outside of the recess by polishing through to the surrounding material on the substrate; and etching remaining portions of the uniformly thick layer to result in formation of the spacer layer.

14. The process according to claim 13, wherein the uniformly thick layer is a first dielectric material, the plug is formed of a second dielectric material, and the differentially thick layer is a third dielectric material.

15. The process according to claim 14, wherein the first dielectric material and the second dielectric material are nitrides and the third dielectric material is an oxide.

16. The process according to claim 13, wherein the layer of the differentially thick layer is deposited by a directional high density plasma etch.

17. The process according to claim 13, wherein the uniformly thick layer lying outside of the recess is etched by a reactive ion etch.

18. The process according to claim 13, wherein etching the uniformly thick layer to result in formation of the spacer layer is carried out by a reactive ion etch.

19. The process according to claim 13, wherein the plug is formed after etching the uniformly thick layer to result in formation of the spacer layer and after formation of the plug, the plug is polished and portions of the differentially thick layer on surfaces surrounding the recess are removed.

20. The process according to claim 13, wherein the differentially thick layer and the trench top are formed simultaneously.

21. The process according to claim 4, further comprising the steps of:

removing the surrounding material;

providing sacrificial oxide regions;

providing well implants;

providing gate oxide regions;

defining gate conductors;

implanting source and drain regions;

providing interlevel dielectric regions; and providing wiring levels.

22. The process according to claim 1, wherein the deep trench capacitor includes a collar region provided by local oxidation of silicon process.

* * * * *